US012003220B2

United States Patent
Zhao et al.

(10) Patent No.: US 12,003,220 B2
(45) Date of Patent: Jun. 4, 2024

(54) HYBRID RF INTEGRATED CIRCUIT DEVICE

(71) Applicant: MACOM Technology Solutions Holdings, Inc., Lowell, MA (US)

(72) Inventors: Lei Zhao, Chandler, AZ (US); Greg Durnan, Tempe, AZ (US); Abdulrhman M. S. Ahmed, Gilbert, AZ (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 252 days.

(21) Appl. No.: 17/022,221

(22) Filed: Sep. 16, 2020

(65) Prior Publication Data

US 2022/0085771 A1    Mar. 17, 2022

(51) Int. Cl.
*H03F 3/195*    (2006.01)
*H03F 1/02*    (2006.01)

(52) U.S. Cl.
CPC ........... *H03F 3/195* (2013.01); *H03F 1/0288* (2013.01); *H03F 2200/318* (2013.01); *H03F 2200/451* (2013.01)

(58) Field of Classification Search
CPC .. H03F 3/195; H03F 1/0288; H03F 2200/318; H03F 2200/451
USPC ......................................................... 330/302
See application file for complete search history.

(56) References Cited

U.S. PATENT DOCUMENTS

| | | | | |
|---|---|---|---|---|
| 9,407,214 | B2 * | 8/2016 | Pribble | H03F 1/56 |
| 2002/0163388 | A1 * | 11/2002 | Luo | H03J 3/20 |
| | | | | 330/305 |
| 2018/0041244 | A1 * | 2/2018 | Ding | H03F 1/3205 |
| 2020/0186097 | A1 * | 6/2020 | Hue | H01L 24/05 |
| 2020/0186107 | A1 * | 6/2020 | Fu | H01L 23/66 |
| 2020/0403576 | A1 * | 12/2020 | Min | H01L 27/0207 |
| 2022/0190849 | A1 * | 6/2022 | Shinozaki | H01L 23/12 |

OTHER PUBLICATIONS

Anera, High-Efficiency and Broadband PA Design Considering the Impact of Device Knee Voltage, Ph.D. thesis from Cardiff University, Published in Jun. 2019. (Year: 2019), Chpater 6, VBW.*
Multistage Doherty MMIC Driver Eliminates Need for Interstage Isolation, by Bill Schweber, Electronic Design, Apr. 2022 (Year: 2022).*
Ding et al. ("A High-Efficiency GaAs MMIC Power Amplifier for Multi-Standard System", IEEE Microwave and Wireless Components Letters, vol. 26, No. 1, Jan. 2016) (Year: 2016).*

* cited by examiner

*Primary Examiner* — Hafizur Rahman
(74) *Attorney, Agent, or Firm* — COATS & BENNETT, PLLC

(57) ABSTRACT

The present disclosure relates to an RF amplifier device including an IC chip including at least one transistor formed on a substrate, at least one operational circuit formed on the substrate and electrically coupled to the transistor, and a port configured to electrically couple the at least one operational circuit with operational circuitry outside the IC chip to adjust operation of the operational circuitry.

29 Claims, 8 Drawing Sheets

HYBRID RF INTEGRATED CIRCUIT DEVICE

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies). These RF transistor amplifiers may need to exhibit high reliability, good linearity and handle high output power levels.

RF amplifiers are widely used in cellular communications systems and other applications. Most RF amplifiers are implemented in silicon or using wide bandgap semiconductor materials, such as silicon carbide (SiC) and Group III-V compounds, such as aluminum (Al), gallium (Ga), and/or indium (In) nitrides. Silicon-based RF amplifiers are typically implemented using laterally diffused metal oxide semiconductor (LDMOS) transistors. Silicon LDMOS RF amplifiers can exhibit high levels of linearity and may be relatively inexpensive to fabricate. Group III nitride-based RF amplifiers are typically implemented using High Electron Mobility Transistors (HEMT) and are primarily used in applications requiring high power and/or high frequency operation where LDMOS transistor amplifiers may have inherent performance limitations. GaN HEMTs are grown on SiC or Si.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier dies are used, they may be connected in series and/or in parallel.

RF transistor amplifiers often include matching circuits, such as (1) impedance matching circuits that are designed to improve the impedance match (for RF signals at the fundamental operating frequency of the amplifier) between the RF transistor amplifier die and transmission lines connected thereto and (2) harmonic termination circuits that are designed to at least partly terminate harmonics that may be generated during device operation, such as second and third order harmonics. The RF transistor amplifier die(s) as well as the impedance matching and harmonic termination circuits may be enclosed in a package. Electrical leads may extend from the package that are used to electrically connect the RF transistor amplifier to external circuit elements such as input and output RF transmission lines and bias voltage sources.

An RF amplifier can be implemented in a monolithic microwave integrated circuit (MIMIC) that provides multiple components formed on a common substrate in a single chip. With the capability of integrating active and passive components in a single chip, MIMICs can enable size reduction compared to discrete designs. MIMICs can also provide a customer with ease of use in production. FIG. 1 shows a MIMIC 100 for a multiple stage transistor with a first transistor 110 and a second transistor 120. In this embodiment, an RF input signal is received at an RF bond pad 125. Input matching circuitry 130 receives the RF signal and provides improved impedance matching at the fundamental frequency of the RF signal between the input and the first transistor 110. The input matching circuit 130 is comprised of a network of inductors and capacitors. The first transistor 110 receives the RF signal from the input matching circuitry 130 and outputs to inter-stage matching circuitry 140. The interstage matching circuitry 140 comprises a network of inductors and capacitors to match the impedance between the first and second transistors 110 and 120 at the fundamental frequency of the RF signal. The second transistor 120 receives the RF signal from the inter-stage matching circuitry 140 and outputs the amplified RF signal to an RF output bond pad 180. The MIMIC 100 can also include output matching circuitry to match the impedance of the second transistor 120 with the output at the fundamental frequency of the RF signal. A DC bias bond pad(s) 185 can provide a bias signal to biasing circuitry 190 for the first and second transistors 110 and 120 as well as other circuitry. Depending on the embodiment, other circuitry can be included in the MIMIC 100 such as harmonic termination circuitry and electrostatic discharge protection (ESD) circuitry. Alternative MIMIC configurations are possible. For example, the MIMIC can comprise a single transistor or multiple transistor stages. Alternatively or additionally, the MIMIC can be utilized as a single path of a multiple path transistor topology, such as a Doherty amplifier configuration.

FIG. 2 is a block diagram of a conventional RF amplifier 200 according to further embodiments of the present invention. The RF amplifier 200 is a multiple path Doherty amplifier. Here, the main transistor 210 and the peaking transistor 220 can each have an optional input prematch 210a, 220a and an optional output prematch 210b, 220b. As shown, an input phase shift 240 is 90 degrees, as is an output phase shift 250. A load 230 receives the output from the circuit. As mentioned above a path can comprise a single stage using a single transistor and no inter-stage matching circuitry or multiple stage transistors. Depending on the embodiment, the MIMIC may or may not include the input or output matching network or some of the other blocks. The fabrication cycle of a die can be weeks or months long. MIMICs lack the tuning flexibility of discrete designs, and usually only work for applications for which they are designed. If one component in a device changes, all the MIMICs related to that device may be rendered worthless to the customer, adding months to the design process with each iteration. A solution to these issues is needed.

SUMMARY

Embodiments of the present disclosure generally relate to a hybrid RF IC device where the operation of the on-chip operational circuitry, such as input matching circuitry, output matching circuitry, interstage matching circuitry, baseband/termination circuitry and/or biasing circuitry, can be more readily adjusted by coupling with off-chip components. The operational circuitry can be adjusted to improve tuning, filtering, bias modulation, and/or baseband/harmonics termination among other operations.

In particular, one or more embodiments include an RF amplifier device including an IC chip including at least one transistor formed on a substrate, at least one operational circuit formed on the substrate and electrically coupled to the transistor, and a port configured to electrically couple the at least one operational circuit with operational circuitry outside the IC chip to adjust operation of the operational circuitry.

In some embodiments, the RF amplifier device operates at a frequency between 0.5 GHz and 1 GHz. In some embodiments, the RF amplifier device operates at a frequency of approximately 3 GHz. In some embodiments, the RF amplifier device operates at a frequency of approximately 10 GHz. In some embodiments, the amplifier device operates at a frequency between 12 GHz and 18 GHz. In some embodiments, the RF amplifier device operates at a frequency between 18 GHz and 27 GHz. In some embodiments, the RF amplifier device operates at a frequency between 27 GHz and 40 GHz. In some embodiments, the operational circuitry includes input matching circuitry. In some embodiments, the RF amplifier device further includes a second transistor, wherein the operational circuitry includes interstage matching circuitry between the at least one transistor and the second transistor. In some embodiments, the operational circuitry comprises output matching circuitry. In some embodiments, the RF amplifier device is comprised of gallium nitride (GaN) and silicon carbide (SiC). In some embodiments, the RF amplifier device includes a second port. In some embodiments, the port includes a bond pad and at least one bond wire that electrically couples the port with off chip circuitry. In some embodiments, a band of operation of the amplifier device is configured to be tuned. In some embodiments, the port affects tuning, harmonics, biasing, and/or filtering of the additional electrical component. In some embodiments, the at least one transistor includes at least a first and a second transistor. In some embodiments, the RF amplifier further includes input matching circuitry at the input of the first transistor. In some embodiments, the RF amplifier further includes output matching circuitry at the output of the second transistor. In some embodiments, the RF amplifier further includes interstage matching circuitry electrically coupled between the first transistor and the second transistor. In some embodiments, the RF amplifier further includes interstage matching circuitry between the first transistor and the second transistor. In some embodiments, the RF amplifier device includes multiple transistor paths. In some embodiments, the RF amplifier device is comprised of a Doherty amplifier. In some embodiments, the RF amplifier device is comprised of a GaN high-electron-mobility transistor (HEMT). In some embodiments, the RF amplifier device is comprised of a silicon-based laterally-diffused metal-oxide semiconductor (LDMOS). In some embodiments, the at least one operational circuit comprises passive components.

One or more embodiments include an RF amplifier device including an IC chip which includes a first transistor formed on a substrate, a second transistor formed on the substrate, at least one operational circuit, wherein the operational circuit is formed on the substrate, the operational circuit is electrically coupled to the transistor, and the operational circuit is positioned between the first transistor and the second transistor, and a port configured to electrically couple the at least one operational circuit with operational circuitry outside the IC chip to adjust operation of the operational circuitry.

One or more embodiments include an RF amplifier device. The RF amplifier device includes an IC including a first transistor formed on a substrate in a first path, a second transistor formed on the substrate in a second path, at least one operational circuit formed on the substrate and electrically coupled to the first transistor, and a port configured to electrically couple the at least one operational circuit with operational circuitry outside the IC chip to adjust operation of the operational circuitry.

In some embodiments, the RF amplifier device further includes input matching circuitry at the input of at least one of the first transistor and the second transistor. In some embodiments, the RF amplifier device further includes output matching circuitry at the output of at least one of the first transistor and the second transistor. In some embodiments, the at least one of the first transistor and the second transistor is a multiple stage transistor. In some embodiments, the RF amplifier device further includes interstage matching circuitry electrically coupled to the at least one of the first transistor and the second transistor that is a multiple stage transistor. In some embodiments, the RF amplifier device further includes interstage matching circuitry between the first transistor and the second transistor.

Of course, those skilled in the art will appreciate that the present embodiments are not limited to the above contexts or examples, and will recognize additional features and advantages upon reading the following detailed description and upon viewing the accompanying drawings

DETAILED DESCRIPTION

Figure 1:
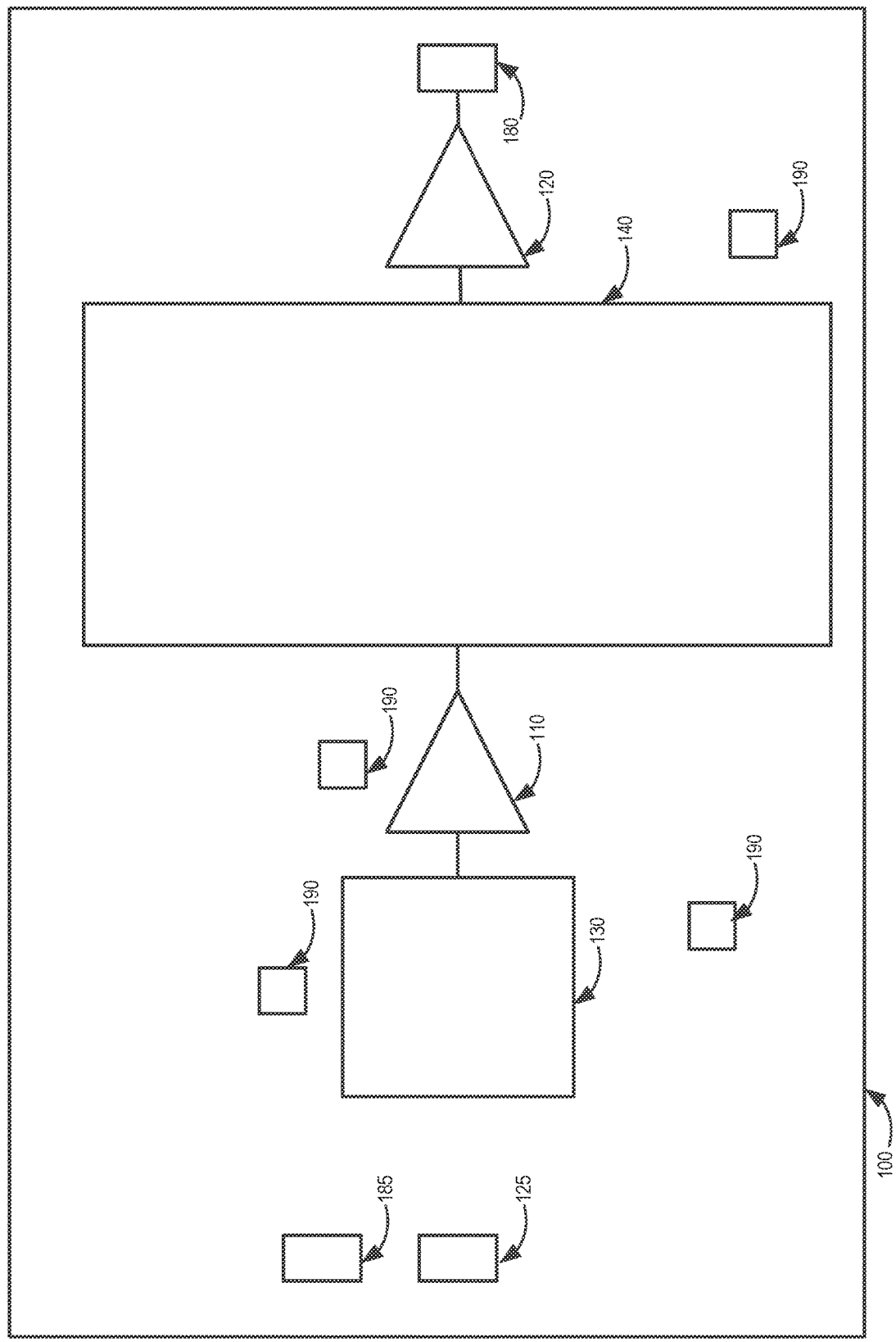
FIG. 1 is a block diagram of a conventional multiple stage MIMIC.
Figure 2:
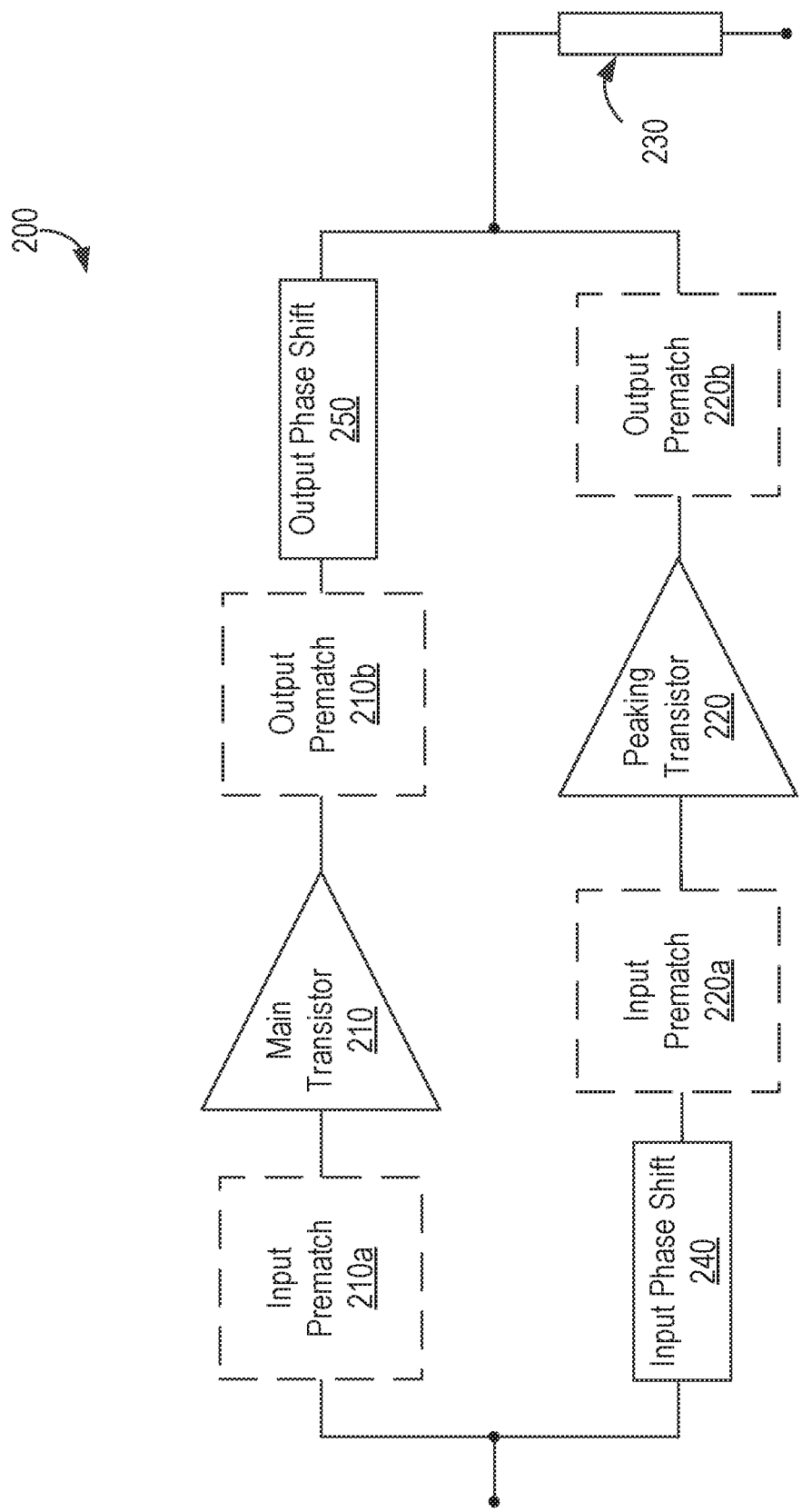
FIG. 2 is a block diagram of a conventional Doherty amplifier configuration.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Moving part of matching circuits off an IC allows the IC to become more flexible in its application. Providing the ability to change, and depending on the embodiment, dynamically change, the components off the IC can reduce the number of fabrication cycles for an IC design by allowing a designer to determine the correct elements to achieve the desired result without having to resort to a trial and error process where each error costs months.

Figure 3A:
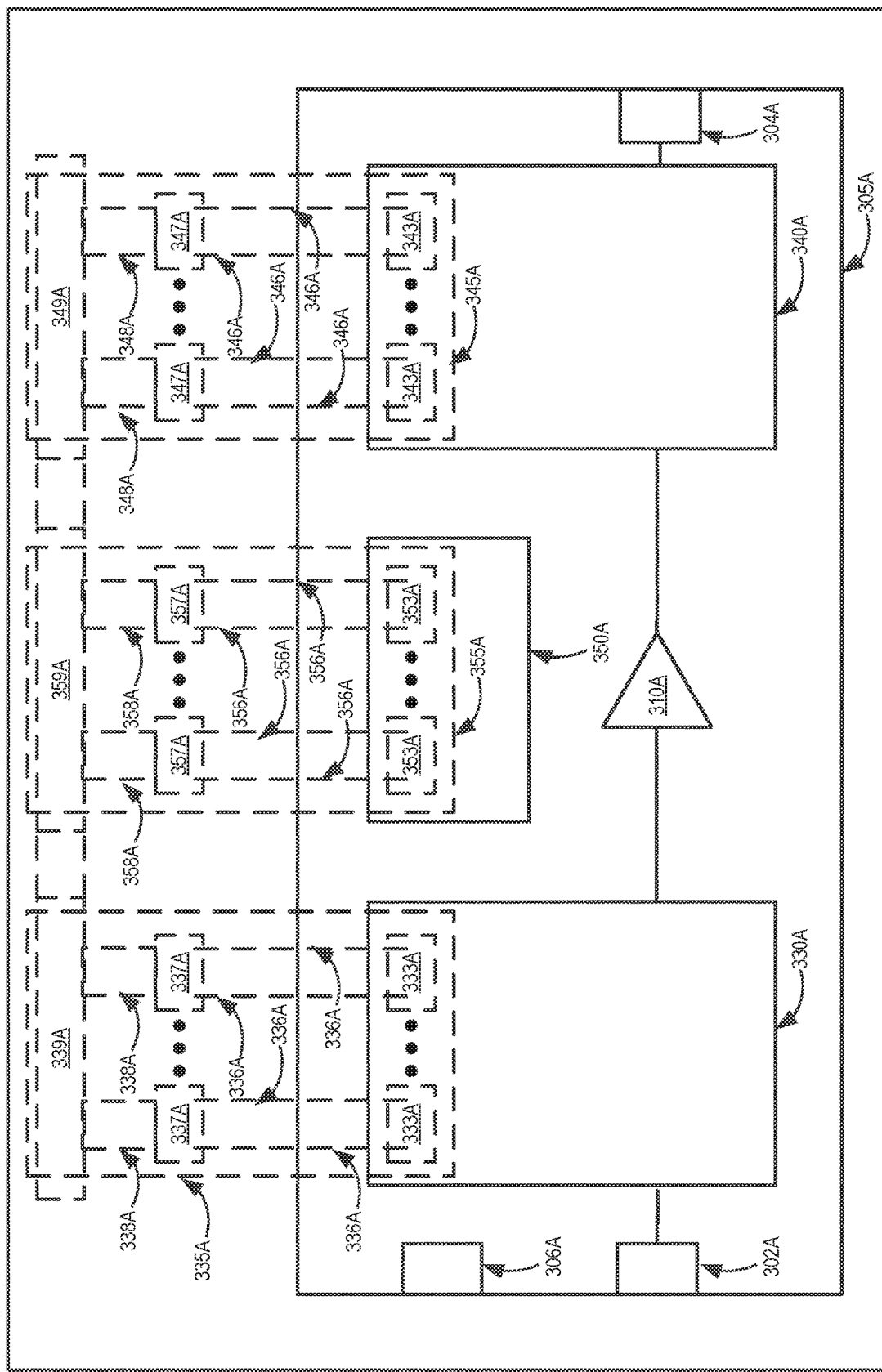
FIG. 3A is 3A is a block diagram of a single transistor stage amplifier device according to embodiments of the present invention.

FIG. 3A is a block diagram of an amplifier device 300A according to embodiments of the present invention. The amplifier device 300A comprises a single transistor stage integrated circuit chip 305A comprising a transistor 310A along with input matching circuitry 330A, output matching circuitry 340A and operational circuitry 350A in addition to or part of the input and output matching circuitry 330A and 340A, such as tuning filtering, harmonic termination, baseband termination, biasing, manufacturing integration circuitry and/or other operational circuitry. Note, depending on the desired configuration of the circuitry the chip 305A need not comprise input matching circuitry 330A, output matching circuitry 340A and additional operational circuitry 350A, such as filtering, harmonic termination, baseband termination, biasing, manufacturing integration circuitry and/or other operational circuitry. In accordance with aspects of the present invention, off chip circuitry can interface with any one, plurality or combinations of the above mentioned circuitry if being utilized on chip 305A to readily change the operational characteristics of the on chip circuitry and efficiently adjust the operation of the amplifier device 300A in a manner that is not possible when such operational circuitry is fully integrated in the chip 305A. In certain embodiments the operational circuitry 330A, 340A and/or 350A is electrically coupled to off chip circuitry that adjust the operation of the operational circuitry to tune the device to provide improved operation in a particular frequency or frequency band. As shown, the amplifier device 300A also includes an RF input 302A, an RF output 304A, and a DC bias 306A.

As illustrated in FIG. 3A showing optionality with dashed lines, input matching circuitry 330A comprises at least one bond pad 333A on the chip 305A that is used to couple the input matching circuitry 330A integrated on chip 305A with off chip input matching circuitry 335A that adjusts the operation of the input matching circuitry 330A and thereby of the device 300A. In certain embodiment, the off chip input matching circuit 335A comprises at least one bond wire 336A electrically coupled to at least one off chip bond pad 337A that is electrically coupled to surface mount passive and/or active components, such as shunt capacitors 338A, that are electrically coupled to ground, such as a ground bus 339A. The ground bus 339A may be specific to the off chip input matching circuit 335A, or it may extend to off chip output matching circuit 345A and/or off chip operational circuitry 355A. Alternatively configurations are possible where the input matching circuitry 330A is not connected to ground but a separate bus or common bus with other input matching circuitry. Alternative active and passive devices, such as capacitors, inductors and resistors are possible. Note the bond wire numbers, lengths and widths or other electrical connectors can be used to adjust the inductance.

As further illustrated in FIG. 3A showing optionality with dashed lines, output matching circuitry 340A comprises at least one bond pad 343A on the chip 305A that is used to couple the output matching circuitry 340A integrated on chip 305A with the off chip output matching circuitry 345A that adjusts the operation of the output matching circuitry 340A and thereby of the device 300A. In certain embodiment, the off chip output matching circuit 345A comprises at least one bond wire 346A electrically coupled to at least one off chip bond pad 347A that is electrically coupled to surface mount passive and/or active components, such as shunt capacitors 348A, that are electrically coupled to ground, such as a ground bus 349A. The ground bus 349A may be specific to the off chip output matching circuit 345A, or it may extend to the off chip input matching circuit 335A and/or the off chip operational circuitry 355A. Alternatively configurations are possible where the output matching circuitry 340A is not connected to ground but a separate bus or common bus with other output matching circuitry. Alternative active and passive devices, such as capacitors, inductors and resistors are possible. Note the bond wire numbers, lengths and widths or other electrical connectors can be used to adjust the inductance.

As also illustrated in FIG. 3A showing optionality with dashed lines, additional operational circuitry 350A comprises at least one bond pad 353A on the chip 305A that is used to couple the output matching circuitry 350A integrated on chip 305A with the off chip output matching circuitry 355A that adjusts the operation of the output matching circuitry 350A and thereby of the device 300A. In certain embodiment, the off chip additional operational circuit 355A comprises at least one bond wire 356A electrically coupled to at least one off chip bond pad 357A that is electrically coupled to surface mount passive and/or active components, such as shunt capacitors 358A, that are electrically coupled to ground, such as a ground bus 359A. The ground bus 359A may be specific to the off chip operational circuit 355A, or it may extend to the off chip input matching circuit 335A and/or the off chip output matching circuitry 345A. Alternatively configurations are possible where the additional operational circuitry 350 is not connected to ground but a separate bus or common bus with other operational circuitry. Alternative active and passive devices, such as capacitors, inductors and resistors are possible. Note the bond wire numbers, lengths and widths or other electrical connectors can be used to adjust the inductance.

Depending on the embodiment, the chip 305A can be on a printed circuit board, metal core printed circuit board, integrated passive device (IPD) structure or any other substrate 390, such as in an overmolded plastic package, an open cavity package with a ceramic or plastic lid or in a laminate package (multilayer PCB). In some embodiments, the amplifier circuit 300A can comprise a transistor, such as a GaN HEMT, comprising Group III nitride materials such as GaN, AlGaN and/or AlN grown on silicon or SiC. In other embodiments the amplifier circuit can comprise an LDMOS transistor comprising silicon or an HBT transistor comprising Gallium Arsenide. In some embodiments, the amplifier circuit 300A operates at a frequency over 1 GHz. The amplifier circuit 300A can also operate and other high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz). In some embodiments, the RF amplifier device 300A can comprise a single path in a multiple transistor path amplifier device, such as a Doherty amplifier.

Figure 3B:
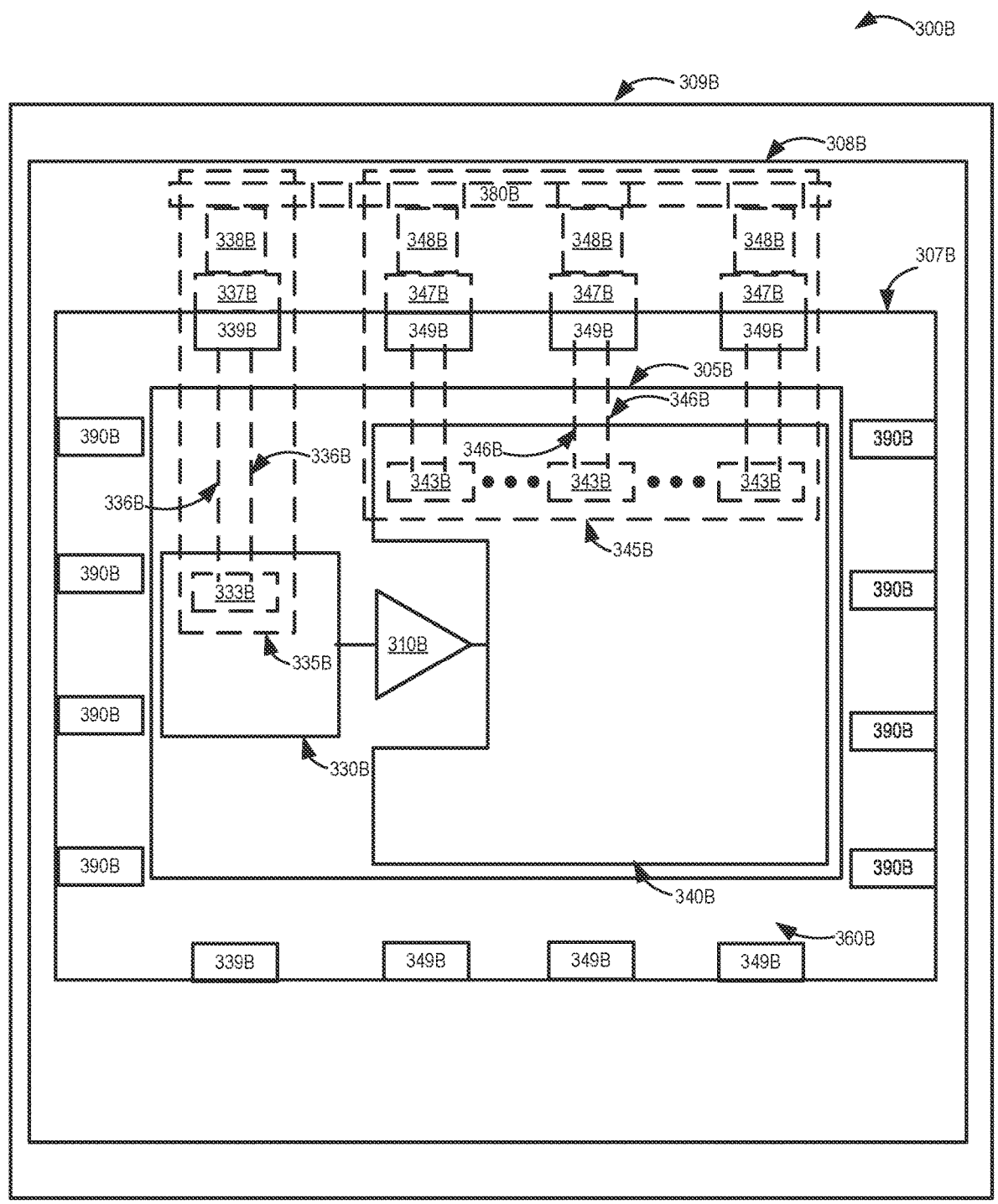
FIG. 3B is a block diagram of a single transistor stage amplifier device according to embodiments of the present invention.

FIG. 3B is a block diagram of an amplifier device 300B according to embodiments of the present invention. The amplifier device 300B comprises a single transistor stage integrated circuit chip 305B comprising a transistor 310B along with input matching circuitry 330B and output matching circuitry 340B. In some embodiments, the integrated circuit chip 305B can comprise other operational circuitry (not shown) in addition to or part of the input and output matching circuitry 330B and 340B, such as tuning filtering, harmonic termination, baseband termination, biasing, manufacturing integration circuitry and/or other operational circuitry. Note, depending on the desired configuration of the circuitry the chip 305B need not comprise input matching circuitry 330B and output matching circuitry. In accordance with aspects of the present invention, off chip circuitry can interface with any one, plurality or combinations of the above mentioned circuitry if being utilized on chip 305B to readily change the operational characteristics of the on chip circuitry and efficiently adjust the operation of the amplifier device 300B in a manner that is not possible when such operational circuitry is fully integrated in the chip 305B. In certain embodiments the operational circuitry 330B and/or 340B is electrically coupled to off chip circuitry that adjust the operation of the operational circuitry to tune the device to provide improved operation in a particular frequency or frequency band, As illustrated in FIG. 3B showing optionality with dashed lines, input matching circuitry 330B comprises at least one bond pad 333B on the chip 305B that is used to couple the input matching circuitry 330B integrated on chip 305B with off chip input matching circuitry 335A that adjusts the operation of the input matching circuitry 330B and thereby of the device 300B. In certain embodiment, the off chip input matching circuit 335B comprises at least one bond wire 336B electrically coupled to at least one trace 337B through at least one lead 339A. The at least one trace 337B is electrically coupled to surface mount passive and/or active components, such as shunt capacitors 338B, that are electrically coupled to ground, such as a ground bus 380B. The ground bus 380B may be specific to the off chip input matching circuit 335B, or it may extend to off chip output matching circuit 345A. Alternatively configurations are possible where the input matching circuitry 330A is not connected to ground but a separate bus or common bus with other input matching circuitry. Alternative active and passive devices, such as capacitors, inductors and resistors are possible. Note the bond wire numbers, lengths and widths or other electrical connectors can be used to adjust the inductance.

As further illustrated in FIG. 3B showing optionality with dashed lines, output matching circuitry 340B comprises at least one bond pad 343B on the chip 305B that is used to couple the output matching circuitry 340B integrated on chip 305B with the off chip output matching circuitry 345B that adjusts the operation of the output matching circuitry 340B and thereby of the device 300B. In certain embodiment, the off chip output matching circuit 345B comprises at least one bond wire 346B electrically coupled to at least one trace 347B through at least one lead 349A. The at least one trace 347B is electrically coupled to surface mount passive and/or active components, such as shunt capacitors 348B, that are electrically coupled to ground, such as the ground bus 380B. The ground bus 380B may be specific to the off chip output matching circuit 345B, or it may extend to the off chip input matching circuit 335A. Alternatively configurations are possible where the output matching circuitry 340B is not connected to ground but a separate bus or common bus with other output matching circuitry. Alternative active and passive devices, such as capacitors, inductors and resistors are possible. Note the bond wire numbers, lengths and widths or other electrical connectors can be used to adjust the inductance.

In contrast to FIG. 3A, FIG. 3B shows the integrated circuit chip 305B already in a package 307B (e.g. in a PQFN Package) mounted onto a substrate 309B, such as a PCB or metal core PCB. The integrated circuit chip 305B can also be mounted within an overmold plastic package or open cavity package having a ceramic or plastic lid. In some embodiments, the RF amplifier circuit 300B can include printed circuit boards (PCB), integrated passive devices (IPD), other substrate types, etc. In some embodiments, the amplifier circuit 300A operates at a frequency over 1 GHz. The amplifier circuit 300B can also operate and other high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz). In some embodiments, the RF amplifier device 300B can comprise a single path in a multiple transistor path amplifier device, such as a Doherty amplifier.

Figure 4A:
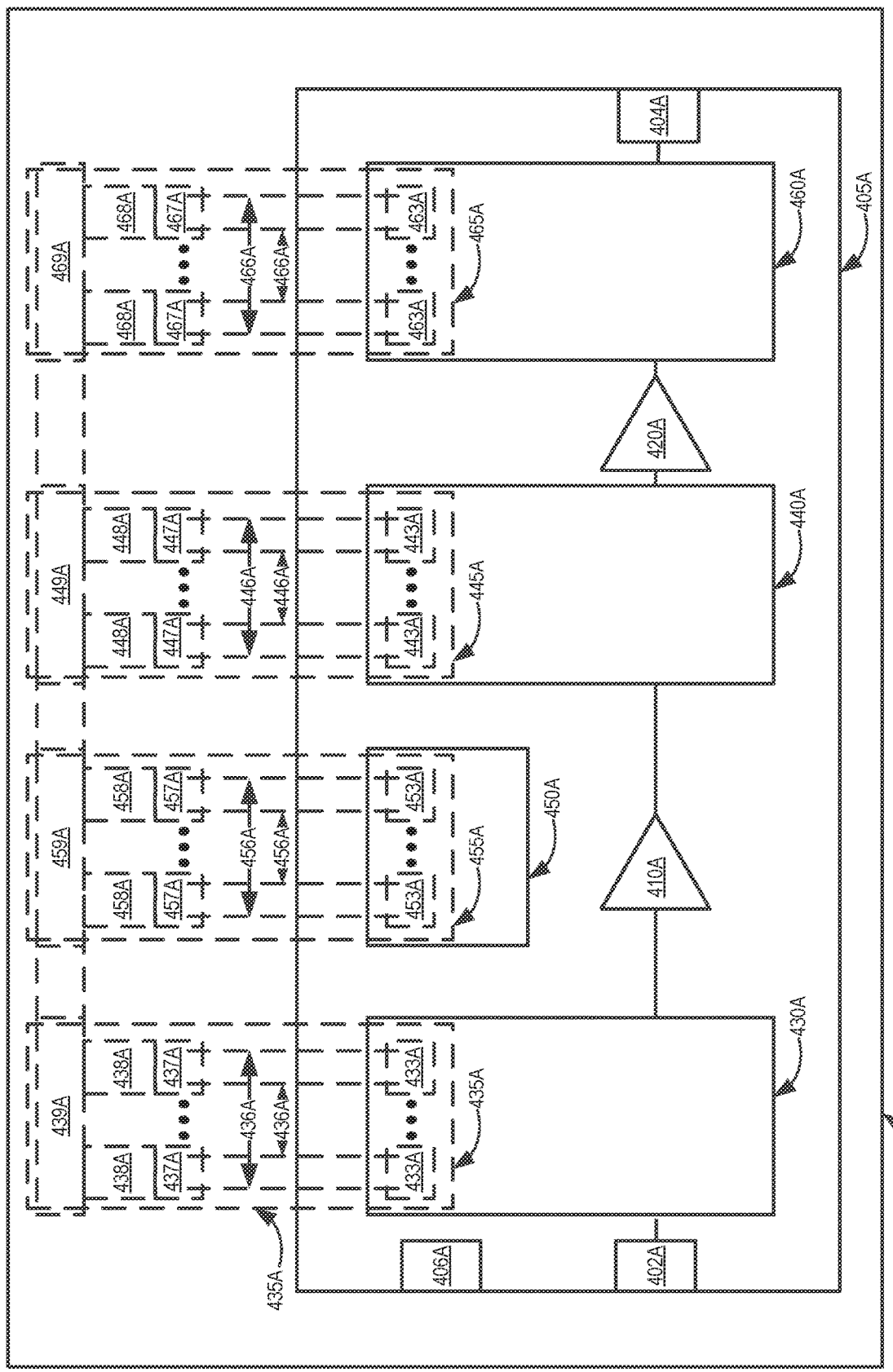
FIG. 4A is a block diagram of a multiple transistor stage amplifier device according to further embodiments of the present invention.

FIG. 4A is a block diagram of an amplifier device 400A according to embodiments of the present invention. The amplifier device 400A comprises a single transistor stage integrated circuit chip 405A comprising a transistor 410A along with input matching circuitry 430A, interstage matching circuitry 440A, output matching circuitry 460A and operational circuitry 450A in addition to or part of the input, interstage and output matching circuitry 430A, 440A and 460A, such as tuning filtering, harmonic termination, baseband termination, biasing, manufacturing integration circuitry and/or other operational circuitry. Note, depending on the desired configuration of the circuitry the chip 405A need not comprise input matching circuitry 430A, output matching circuitry 460A and additional operational circuitry 450A, such as filtering, harmonic termination, baseband termination, biasing, manufacturing integration circuitry and/or other operational circuitry. In accordance with aspects of the present invention, off chip circuitry can interface with any one, plurality or combinations of the above mentioned circuitry if being utilized on chip 405A to readily change the operational characteristics of the on chip circuitry and efficiently adjust the operation of the amplifier device 400A in a manner that is not possible when such operational circuitry is fully integrated in the chip 405A. In certain embodiments the operational circuitry 430A, 460A and/or 450A is electrically coupled to off chip circuitry that adjust the operation of the operational circuitry to tune the device to provide improved operation in a particular frequency or frequency band. As shown, the amplifier device 400A also includes an RF input 402A, an RF output 404A, and a DC bias 406A.

As illustrated in FIG. 4A showing optionality with dashed lines, input matching circuitry 430A comprises at least one bond pad 433A on the chip 405A that is used to couple the input matching circuitry 430A integrated on chip 405A with off chip input matching circuitry 435A that adjusts the operation of the input matching circuitry 430A and thereby of the device 400A. In certain embodiment, the off chip input matching circuit 435A comprises at least one bond wire 436A electrically coupled to at least one off chip bond pad 437A that is electrically coupled to surface mount passive and/or active components, such as shunt capacitors 438A, that are electrically coupled to ground, such as a ground bus 439A. The ground bus 439A may be specific to the off chip input matching circuit 435A, or it may extend to off chip interstage matching circuit 445A, off chip output matching circuitry 465A and/or off chip operational circuitry 455A. Alternatively configurations are possible where the input matching circuitry 430A is not connected to ground but a separate bus or common bus with other input matching circuitry. Alternative active and passive devices, such as capacitors, inductors and resistors are possible. Note the bond wire numbers, lengths and widths or other electrical connectors can be used to adjust the inductance.

Also illustrated in FIG. 4A, shown optionality with dashed lines, interstage matching circuitry 440A comprises at least one bond pad 443A on the chip 405A that is used to couple the interstage matching circuitry 440A integrated on chip 405A with the off chip interstage matching circuitry 445A that adjusts the operation of the interstage matching circuitry 440A and thereby of the device 400A. In certain embodiment, the off chip interstage matching circuit 445A comprises at least one bond wire 446A electrically coupled to at least one off chip bond pad 447A that is electrically coupled to surface mount passive and/or active components, such as shunt capacitors 448A, that are electrically coupled to ground, such as a ground bus 449A. The ground bus 449A may be specific to the off chip interstage matching circuit 445A, or it may extend to the off chip input matching circuit 435A, the off chip output matching circuitry 465A and/or the off chip operational circuitry 455A. Alternatively configurations are possible where the interstage matching circuitry 440A is not connected to ground but a separate bus or common bus with other interstage matching circuitry. Alternative active and passive devices, such as capacitors, inductors and resistors are possible. Note the bond wire numbers, lengths and widths or other electrical connectors can be used to adjust the inductance.

As further illustrated in FIG. 4A showing optionality with dashed lines, output matching circuitry 460A comprises at least one bond pad 463A on the chip 405A that is used to couple the output matching circuitry 460A integrated on chip 405A with off chip output matching circuitry 465A that adjusts the operation of the output matching circuitry 460A and thereby of the device 400A. In certain embodiment, the off chip output matching circuit 465A comprises at least one bond wire 466A electrically coupled to at least one off chip bond pad 467A that is electrically coupled to surface mount passive and/or active components, such as shunt capacitors 468A, that are electrically coupled to ground, such as a ground bus 469A. The ground bus 469A may be specific to the off chip output matching circuit 465A, or it may extend to off chip input matching circuit 435A, off chip interstage matching circuitry 445A and/or off chip operational circuitry 455A. Alternatively configurations are possible where the output matching circuitry 460A is not connected to ground but a separate bus or common bus with other output matching circuitry. Alternative active and passive devices, such as capacitors, inductors and resistors are possible. Note the bond wire numbers, lengths and widths or other electrical connectors can be used to adjust the inductance.

As also illustrated in FIG. 4A showing optionality with dashed lines, additional operational circuitry 450A comprises at least one bond pad 453A on the chip 405A that is used to couple the operational circuitry 450A integrated on chip 405A with off chip operational matching circuitry 455A that adjusts the operation of the operational circuitry 450A and thereby of the device 400A. In certain embodiment, the off chip additional operational circuit 455A comprises at least one bond wire 456A electrically coupled to at least one off chip bond pad 457A that is electrically coupled to surface mount passive and/or active components, such as shunt capacitors 458A, that are electrically coupled to ground, such as a ground bus 459A. The ground bus 459A may be specific to the off chip operational circuit 465A, or it may extend to off chip input matching circuit 435A, off chip interstage matching circuitry 445A and/or off chip output matching circuitry 465A. Alternatively configurations are possible where the additional operational circuitry 450 is not connected to ground but a separate bus or common bus with other operational circuitry. Alternative active and passive devices, such as capacitors, inductors and resistors are possible. Note the bond wire numbers, lengths and widths or other electrical connectors can be used to adjust the inductance.

Depending on the embodiment, the chip 405A can be on a printed circuit board, metal core printed circuit board, integrated passive device (IPD) structure or any other substrate 490, such as in an overmolded plastic package, an open cavity package with a ceramic or plastic lid or in a laminate package (multilayer PCB). In some embodiments, the amplifier circuit 400A can comprise a transistor, such as a GaN HEMT, comprising Group III nitride materials such as GaN, AlGaN and/or AlN grown on silicon or SiC. In other embodiments the amplifier circuit can comprise an LDMOS transistor comprising silicon or an HBT transistor comprising Gallium Arsenide. In some embodiments, the amplifier circuit 400A operates at a frequency over 1 GHz. The amplifier circuit 400A can also operate and other high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz). In some embodiments, the RF amplifier device 400A can comprise a single path in a multiple transistor path amplifier device, such as a Doherty amplifier.

Figure 4B:
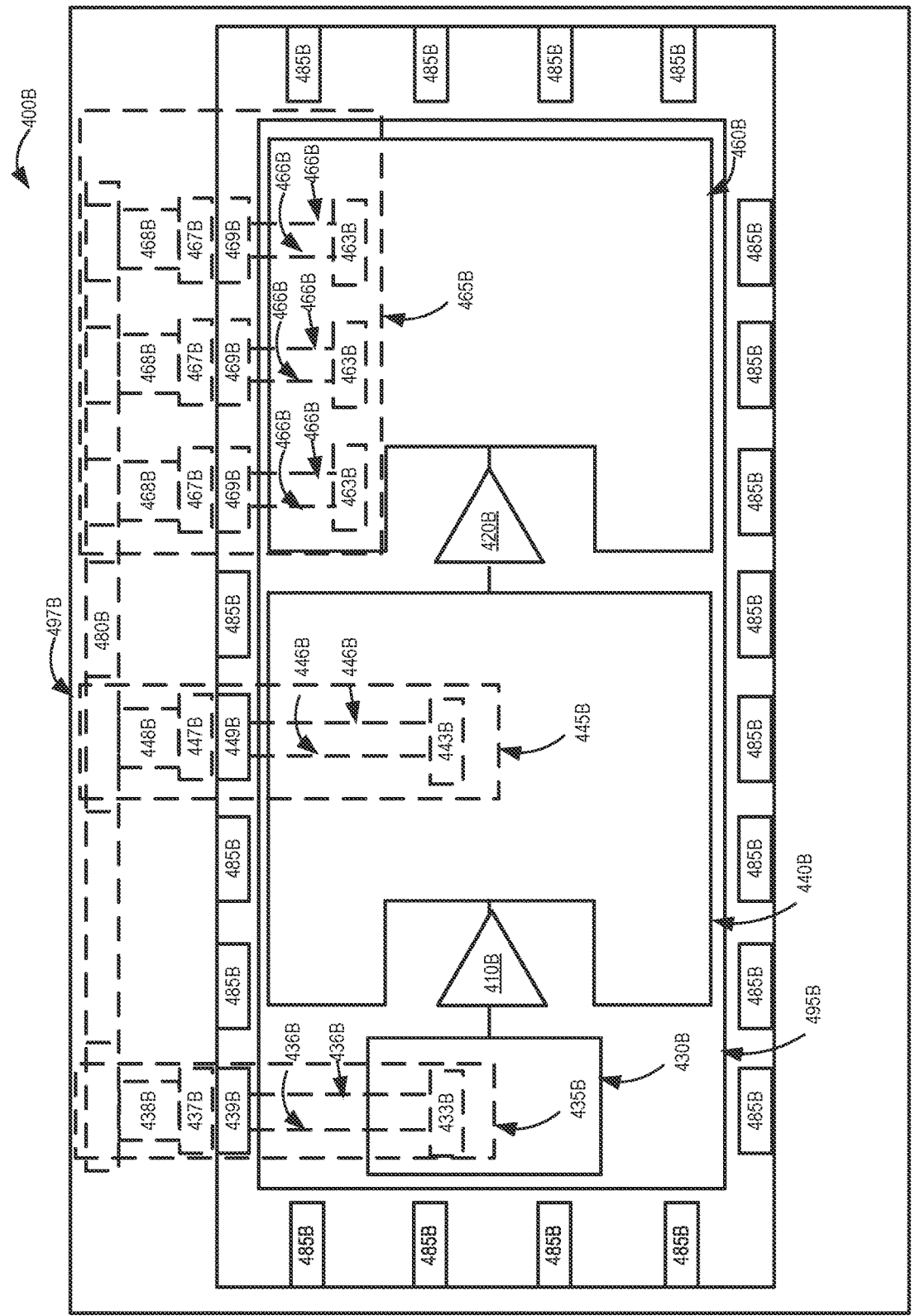
FIG. 4B is a block diagram of a multiple transistor stage amplifier device according to further embodiments of the present invention.

FIG. 4B is a block diagram of an amplifier device 400B according to embodiments of the present invention. The amplifier device 400B comprises a single transistor stage integrated circuit chip 405B comprising a transistor 410B along with input matching circuitry 430B and output matching circuitry 460B. In some embodiments, the integrated circuit chip 405B can comprise other operational circuitry (not shown) in addition to or part of the input and output matching circuitry 430B and 460B, such as tuning filtering, harmonic termination, baseband termination, biasing, manufacturing integration circuitry and/or other operational circuitry. Note, depending on the desired configuration of the circuitry the chip 405B need not comprise input matching circuitry 430B and output matching circuitry. In accordance with aspects of the present invention, off chip circuitry can interface with any one, plurality or combinations of the above mentioned circuitry if being utilized on chip 405B to readily change the operational characteristics of the on chip circuitry and efficiently adjust the operation of the amplifier device 400B in a manner that is not possible when such operational circuitry is fully integrated in the chip 405B. In certain embodiments the operational circuitry 430B and/or 460B is electrically coupled to off chip circuitry that adjust the operation of the operational circuitry to tune the device to provide improved operation in a particular frequency or frequency band, As illustrated in FIG. 4B showing optionality with dashed lines, input matching circuitry 430B comprises at least one bond pad 433B on the chip 405B that is used to couple the input matching circuitry 430B integrated on chip 405B with off chip input matching circuitry 435A that adjusts the operation of the input matching circuitry 430B and thereby of the device 400B. In certain embodiment, the off chip input matching circuit 435B comprises at least one bond wire 436B electrically coupled to at least one trace 437B through at least one lead 439A. The at least one trace 437B is electrically coupled to surface mount passive and/or active components, such as shunt capacitors 438B, that are electrically coupled to ground, such as a ground bus 480B. The ground bus 480B may be specific to the off chip input matching circuit 435B, or it may extend to off chip interstage matching circuit 445B and/or off chip output matching circuitry 465B. Alternatively configurations are possible where the input matching circuitry 430A is not connected to ground but a separate bus or common bus with other input matching circuitry. Alternative active and passive devices, such as capacitors, inductors and resistors are possible. Note the bond wire numbers, lengths and widths or other electrical connectors can be used to adjust the inductance.

Also illustrated in FIG. 4B, shown optionality with dashed lines, interstage matching circuitry 440B comprises at least one bond pad 443B on the chip 405B that is used to couple the interstage matching circuitry 440B integrated on chip 405B with the off chip interstage matching circuitry 445B that adjusts the operation of the interstage matching circuitry 440B and thereby of the device 400B. In certain embodiment, the off chip interstage matching circuit 445B comprises at least one bond wire 446B electrically coupled to at least one trace 447B through at least one lead 449A. The at least one trace 437B is electrically coupled to surface mount passive and/or active components, such as shunt capacitors 448B, that are electrically coupled to ground, such as the ground bus 480B. The ground bus 480B may be specific to the off chip interstage matching circuit 445B, or it may extend to the off chip input matching circuit 435B and/or the off chip output matching circuitry 465B. Alternatively configurations are possible where the interstage matching circuitry 440B is not connected to ground but a separate bus or common bus with other interstage matching circuitry. Alternative active and passive devices, such as capacitors, inductors and resistors are possible. Note the bond wire numbers, lengths and widths or other electrical connectors can be used to adjust the inductance.

As further illustrated in FIG. 4B showing optionality with dashed lines, output matching circuitry 460B comprises at least one bond pad 463B on the chip 405B that is used to couple the output matching circuitry 460B integrated on chip 405B with the off chip output matching circuitry 465B that adjusts the operation of the output matching circuitry 460B and thereby of the device 400B. In certain embodiment, the off chip output matching circuit 465B comprises at least one bond wire 466B electrically coupled to at least one trace 467B through at least one lead 469A. The at least one trace 437B is electrically coupled to surface mount passive and/or active components, such as shunt capacitors 468B, that are electrically coupled to ground, such as the ground bus 480B. The ground bus 480B may be specific to the off chip output matching circuit 465B, or it may extend to the off chip input matching circuit 435B and/or the off chip interstage matching circuitry 445B. Alternatively configurations are possible where the output matching circuitry 460B is not connected to ground but a separate bus or common bus with other output matching circuitry. Alternative active and passive devices, such as capacitors, inductors and resistors are possible. Note the bond wire numbers, lengths and widths or other electrical connectors can be used to adjust the inductance.

In contrast to FIG. 4A, FIG. 4B shows the integrated circuit chip 405B already in a package 407B (e.g. in a PQFN Package) mounted onto a substrate 409B, such as a PCB or metal core PCB. The integrated circuit chip 405B can also be mounted within an overmold plastic package or open cavity package having a ceramic or plastic lid. In some embodiments, the RF amplifier circuit 400B can include printed circuit boards (PCB), integrated passive devices (IPD), other substrate types, etc. In some embodiments, the amplifier circuit 400A operates at a frequency over 1 GHz. The amplifier circuit 400B can also operate and other high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz). In some embodiments, the RF amplifier device 400B can comprise a single path in a multiple transistor path amplifier device, such as a Doherty amplifier.

Figure 5A:
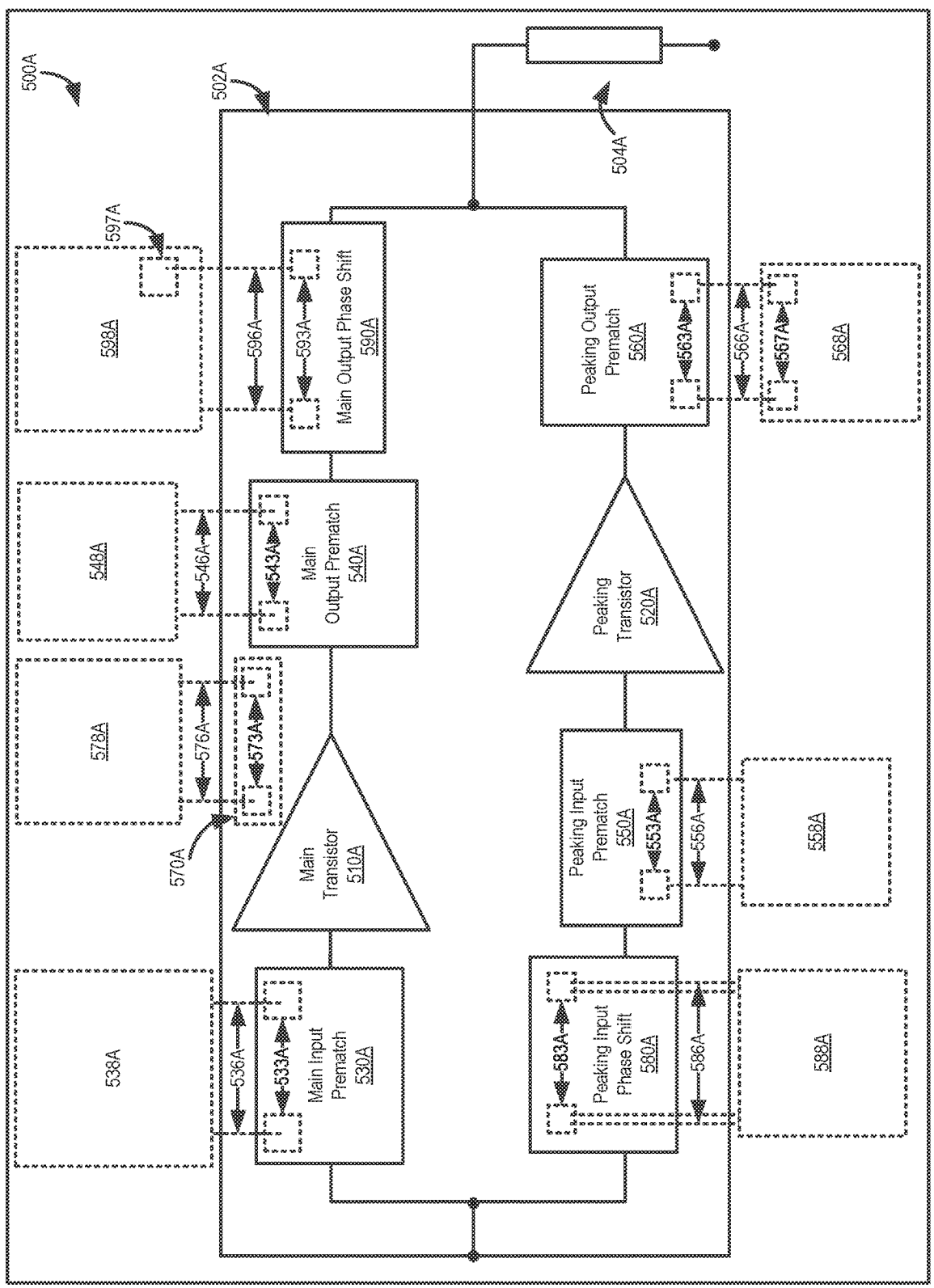
FIGS. 5A and 5B are a block diagram of an amplifier device in a Doherty configuration according to embodiments of the present invention.

FIG. 5A is a block diagram of an amplifier device 500A according to embodiments of the present invention. The amplifier device 500A comprises a multiple transistor path integrated circuit chip 502A comprising a main transistor 510A and a peaking transistor 520A. On the path for the main transistor 510A, there is a main input prematch circuitry 530A, a main output prematch circuitry 540A, and a main output phase shift 590A. On the path for the peaking transistor 520A, there is a peaking input phase shift circuitry 580A, a peaking input prematch circuitry 550A, and an output prematch circuitry 560A. In some embodiments, the amplifier device 500A can comprise other operational circuitry 570A, such as tuning filtering, harmonic termination, baseband termination, biasing, manufacturing integration circuitry and/or other operational circuitry. Also shown is a load 504A that receives output from the paths.

The main input prematch circuitry 530A has bond pads 533A that are electrically connected to off chip input prematch circuitry 538A using wire bonds 536A. The main output prematch circuitry 540A has bond pads 543A that are electrically connected to off chip output prematch circuitry 548A using wire bonds 546A. The main output phase shift circuitry 590A has bond pads 593A that are electrically connected to off chip output phase shift circuitry 598A using wire bonds 596A. In some embodiments, as shown with the off chip output phase shift circuitry 598A, there may be an off chip bond pad 597A electrically connected to a wire bond 596A and affixed to the off chip output phase shift circuitry 598A.

The peaking input phase shift circuitry 580A has bond pads 583A that are electrically connected to off chip input phase shift circuitry 588A using wire bonds 586A. In some embodiments, as shown in FIG. 5A, a bond pad 583A can be electrically connected to more than one bond wire 586A. The peaking input prematch circuitry 550A is electrically connected to off chip input prematch circuitry 558A using wire bonds 556A. The peaking output phase shift circuitry 560A has bond pads 563A that are electrically connected to off chip output phase shift circuitry 568A using wire bonds 566A. In some embodiments, as shown with the off chip output phase shift circuitry 568A, there may be an off chip bond pad 567A electrically connected to each wire bond 566A and affixed to the off chip output phase shift circuitry 568A. In some embodiments, the operational circuitry 570A can have bond pads 573A electrically connected to off chip operational circuitry 570A using wire bonds 576A.

Depending on the embodiment, the chip 502A can be on a printed circuit board, metal core printed circuit board, integrated passive device (IPD) structure or any other substrate, such as in an overmolded plastic package, an open cavity package with a ceramic or plastic lid or in a laminate package (multilayer PCB). In some embodiments, the amplifier circuit 500A can comprise a transistor, such as a GaN HEMT, comprising Group III nitride materials such as GaN, AlGaN and/or AlN grown on silicon or SiC. In other embodiments the amplifier circuit can comprise an LDMOS transistor comprising silicon or an HBT transistor comprising Gallium Arsenide. In some embodiments, the amplifier circuit 400A operates at a frequency over 1 GHz. The amplifier circuit 400A can also operate and other high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz). In some embodiments, the RF amplifier device 400A can comprise a single path in a multiple transistor path amplifier device, such as a Doherty amplifier.

Figure 5B:
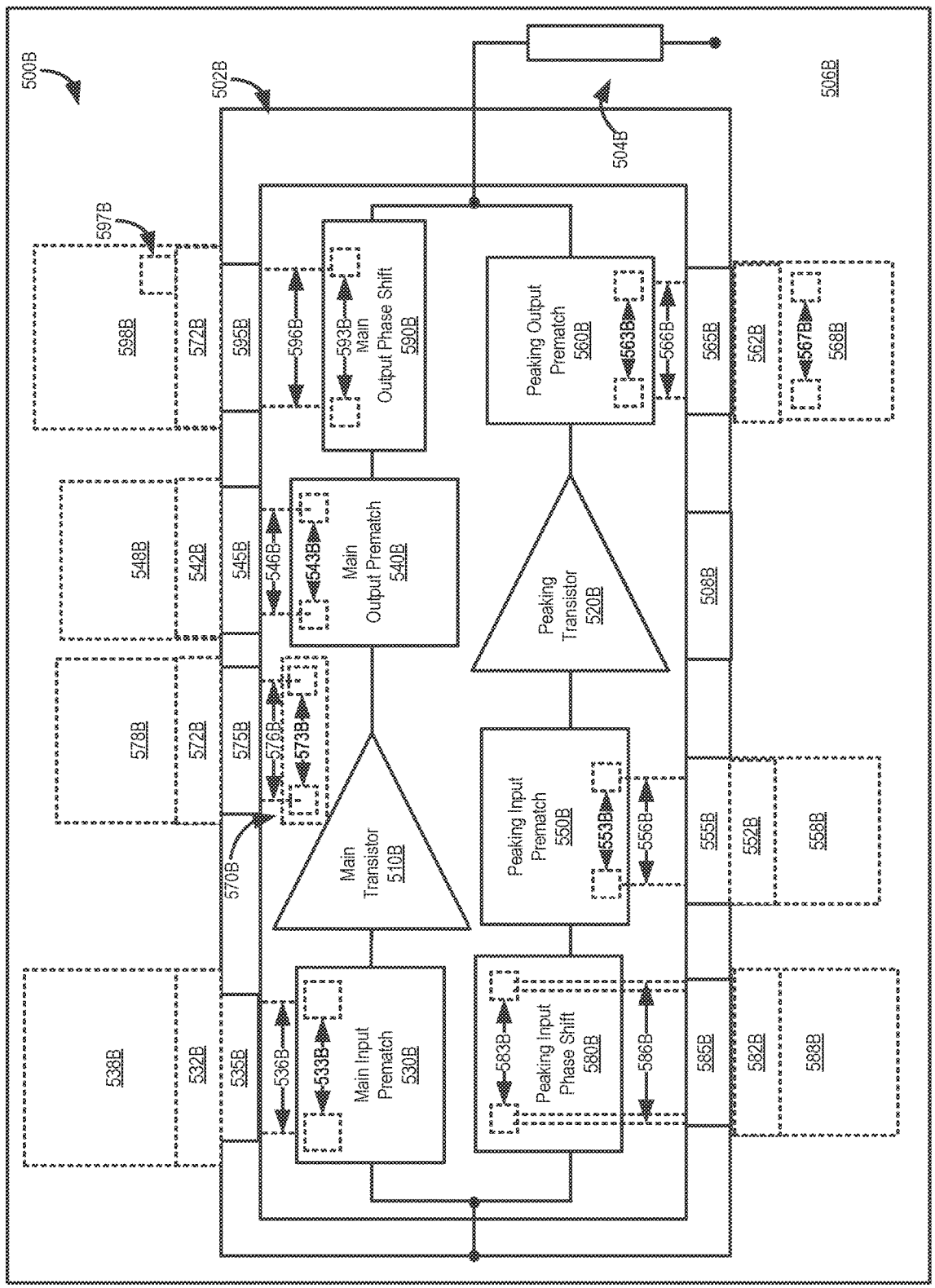

FIG. 5B is a block diagram of an amplifier device 500B according to embodiments of the present invention. The amplifier device 500B comprises a multiple transistor path integrated circuit chip 502B comprising a main transistor 510B and a peaking transistor 520B. On the path for the main transistor 510B, there is a main input prematch circuitry 530B, a main output prematch circuitry 540B, and a main output phase shift 590B. On the path for the peaking transistor 520B, there is a peaking input phase shift circuitry 580B, a peaking input prematch circuitry 550B, and an output prematch circuitry 560B. In some embodiments, the amplifier device 500B can comprise other operational circuitry 570B, such as tuning filtering, harmonic termination, baseband termination, biasing, manufacturing integration circuitry and/or other operational circuitry. Also shown is a load 504B that receives output from the paths.

The main input prematch circuitry 530B has bond pads 533B that are electrically connected to off chip input prematch circuitry 538B using wire bonds 536B that connect to a lead 535B connected to a trace 532B for the off chip input prematch circuitry 538B. The main output prematch circuitry 540B has bond pads 543B that connect to a lead 545B connected to a trace 542B for off chip output prematch circuitry 548B using wire bonds 546B. The main output phase shift circuitry 590B has bond pads 593B that are electrically connected to off chip output phase shift circuitry 598B using wire bonds 596A that connect to a lead 595B connected to a trace 592B for the off chip output phase shift circuitry 598B. In some embodiments, as shown with the off chip output phase shift circuitry 598B, there may be an off chip bond pad 597B electrically connected to the trace 595B and affixed to the off chip output phase shift circuitry 598B.

The peaking input phase shift circuitry 580A has bond pads 583A that are electrically connected to a lead 585B connected to a trace 582B for an off chip input phase shift circuitry 588B using wire bonds 586B. In some embodiments, as shown in FIG. 5B, a bond pad 58BA can be electrically connected to more than one bond wire 586B. The peaking input prematch circuitry 550B is electrically connected to a lead 555B using wire bonds 556A. The lead 555B is connected to off chip input prematch circuitry 558B using a trace 552B. The peaking output phase shift circuitry 560B has bond pads 563B that are electrically connected to off chip output phase shift circuitry 568B using wire bonds 566B to connect to a lead 565B connected to a trace 562B for the off chip output phase shift circuitry 568B. In some embodiments, as shown with the off chip output phase shift circuitry 568B, there may be an off chip bond pad 567B for each respective on chip bond pad 563B. In some embodiments, the operational circuitry 570B can have bond pads 573B electrically connected to off chip operational circuitry 578B using wire bonds 576B that are connected to a lead 575B to a trace 572B for the off chip operational circuitry 578B.

In contrast to FIG. 5A, FIG. 5B shows the integrated circuit chip 502B already in a package (e.g. in a PQFN Package) mounted onto a substrate 506B, such as a PCB or metal core PCB. The integrated circuit chip 502B can also be mounted within an overmold plastic package or open cavity package having a ceramic or plastic lid. In some embodiments, the RF amplifier device 500B can include printed circuit boards (PCB), integrated passive devices (IPD), other substrate types, etc. In some embodiments, the amplifier device 500A operates at a frequency over 1 GHz. The amplifier device 500B can also operate and other high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz). In some embodiments, the RF amplifier device 500B can comprise a single path in a multiple transistor path amplifier device, such as a Doherty amplifier.

It should be noted that a transistor or path shown in FIGS. 5A and 5B can use the transistor devices of FIGS. 3 and 4, and the amplifier devices of FIGS. 3 and 4 can be used in a multiple transistor path amplifier device, such as a Doherty amplifier.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein. Although steps of various processes or methods described herein may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention.

What is claimed is:

1. A Radio Frequency (RF) amplifier device comprising:
an integrated circuit (IC) chip comprising:
a substrate;
a first transistor formed on the substrate;
a first operational circuit comprising one or more electrical components, other than a bonding pad, bond wire, or other conductor, formed on the substrate and electrically coupled to the first transistor, and configured to perform one or more of impedance matching, phase shifting, and harmonic termination operations; and
a first port, other than an RF input or output, comprising a bond pad and at least one bond wire and configured to electrically couple the first operational circuit with external circuitry to thereby adjust the impedance matching, phase shifting, or harmonic termination operations;
whereby the one or more components of the first operational circuit and the external circuitry together perform RF tuning.

2. The RF amplifier device of claim 1, wherein the fundamental frequency is between 0.5 GHz and 1 GHz.

3. The RF amplifier device of claim 1, wherein the fundamental frequency is approximately 3 GHz.

4. The RF amplifier device of claim 1, wherein the fundamental frequency is approximately 10 GHz.

5. The RF amplifier device of claim 1, wherein the fundamental frequency is between 12 GHz and 18 GHz.

6. The RF amplifier device of claim 1, wherein the fundamental frequency is between 18 GHz and 27 GHz.

7. The RF amplifier device of claim 1, wherein the fundamental frequency is between 27 GHz and 40 GHz.

8. The RF amplifier device of claim 1, wherein the first operational circuit comprises input matching circuit.

9. The RF amplifier device of claim 1, further comprising a second transistor, wherein the first operational circuit comprises interstage matching circuitry between the first transistor and the second transistor.

10. The RF amplifier device of claim 1, wherein the first operational circuit comprises an output matching circuit.

11. The RF amplifier device of claim 1, wherein the amplifier device comprises gallium nitride (GaN) and silicon carbide (SiC).

12. The RF amplifier device of claim 1, further comprising a second port.

13. An RF amplifier device comprising:
an integrated circuit (IC) chip comprising:
a substrate;
a first transistor formed on the substrate in a first path;
a second transistor formed on the substrate in a second path;
a first operational circuit formed on the substrate and comprising one or more electrical components, other than a bonding pad, bond wire, or other conductor, and electrically coupled to the first transistor, and configured to perform one or more of impedance matching, phase shifting, and harmonic termination operations; and
a port, other than an RF input or output, comprising a bond pad and at least one bond wire and configured to electrically couple the first operational circuit with external circuitry to thereby adjust the impedance matching, phase shifting, or harmonic termination operations;
whereby the one or more components of the first operational circuit and the external circuitry together perform RF tuning.

14. The RF amplifier device of claim 1, wherein the fundamental frequency is configured to be tuned.

15. The RF amplifier device of claim 13, wherein at least one of the first transistor and the second transistor is a multiple stage transistor.

16. The RF amplifier device of claim 1, further comprising a second transistor.

17. The RF amplifier device of claim 16, further comprising input matching circuitry at the input of the first transistor.

18. The RF amplifier device of claim 16, further comprising output matching circuitry at the output of the second transistor.

19. The RF amplifier device of claim 16, further comprising interstage matching circuitry electrically coupled between the first transistor and the second transistor.

20. The RF amplifier device of claim 15, further comprising interstage matching circuitry electrically coupled to the at least one of the first transistor and the second transistor that is a multiple stage transistor.

21. The RF amplifier device of claim 1, further comprising multiple transistor paths.

22. The RF amplifier device of claim 1, wherein the RF amplifier device comprises a Doherty amplifier.

23. The RF amplifier device of claim 1, wherein the RF amplifier device comprises a GaN high-electron-mobility transistor (HEMT).

24. The RF amplifier device of claim 1, wherein the RF amplifier device comprises a silicon-based laterally-diffused metal-oxide semiconductor (LDMOS).

25. The RF amplifier device of claim 1, wherein the first operational circuit comprises passive components.

26. An RF amplifier device comprising:
an integrated circuit (IC) chip comprising:
a substrate;
a first transistor formed on the substrate,
a second transistor formed on the substrate,
a first operational circuit comprising one or more electrical components, other than a bonding pad, bond wire, or other conductor, wherein
the first operational circuit is formed on the substrate,
the first operational circuit is electrically coupled to both the first and second transistors, and
the first operational circuit is configured to perform one or more of impedance matching, phase shifting, and harmonic termination operations; and
a port, other than an RF input or output, comprising a bond pad and at least one bond wire and configured to electrically couple the first operational circuit with external circuitry to thereby adjust the impedance matching, phase shifting, or harmonic termination operations;

whereby the one or more components of the first operational circuit and the external circuitry together perform RF tuning.

27. The RF amplifier device of claim 13 further comprising interstage matching circuitry between the first transistor and the second transistor.

28. The RF amplifier device of claim 13, further comprising input matching circuitry at the input of at least one of the first transistor and the second transistor.

29. The RF amplifier device of claim 13, further comprising output matching circuitry at the output of at least one of the first transistor and the second transistor.

* * * * *